United States Patent
Horishita et al.

(10) Patent No.: US 8,467,211 B2
(45) Date of Patent: Jun. 18, 2013

(54) BIPOLAR PULSED POWER SUPPLY AND POWER SUPPLY APPARATUS HAVING PLURALITY OF BIPOLAR PULSED POWER SUPPLIES

(75) Inventors: Yoshikuni Horishita, Kanagawa (JP); Shinobu Matsubara, Kanagawa (JP); Atsushi Ono, Kanagawa (JP)

(73) Assignee: Ulvac, Inc., Kanagawa (JP)

( * ) Notice: Subject to any disclaimer, the term of this patent is extended or adjusted under 35 U.S.C. 154(b) by 407 days.

(21) Appl. No.: 12/989,444

(22) PCT Filed: May 20, 2009

(86) PCT No.: PCT/JP2009/059271
§ 371 (c)(1),
(2), (4) Date: Oct. 25, 2010

(87) PCT Pub. No.: WO2009/145091
PCT Pub. Date: Dec. 3, 2009

(65) Prior Publication Data
US 2011/0038187 A1 Feb. 17, 2011

(30) Foreign Application Priority Data
May 26, 2008 (JP) ................................ 2008-137077

(51) Int. Cl.
*H02M 7/537* (2006.01)
*H02M 7/5387* (2007.01)

(52) U.S. Cl.
USPC .................. 363/98; 204/298.08; 323/266

(58) Field of Classification Search
USPC ...... 363/65, 71, 95, 97, 98, 34, 36; 204/192.1, 204/192.12, 192.17, 298.08, 298.41; 323/266
See application file for complete search history.

(56) References Cited

U.S. PATENT DOCUMENTS

| | | | |
|---|---|---|---|
| 5,303,139 A | 4/1994 | Mark | |
| 5,773,799 A | 6/1998 | Maxfield et al. | |
| 6,063,245 A | 5/2000 | Frach et al. | |
| 6,096,174 A | 8/2000 | Teschner et al. | |
| 7,455,755 B2 * | 11/2008 | Tuymer et al. | 204/298.08 |
| 7,615,937 B2 * | 11/2009 | Mishima | 315/291 |

FOREIGN PATENT DOCUMENTS

JP 06-113561 A 4/1994

OTHER PUBLICATIONS

"A Wide-Ranging Power Supply of Compact Dimensions," Hewlett-Packard Journal, published in 1977, pp. 1-20, Hewlett-Packard Co., US.

* cited by examiner

*Primary Examiner* — Gary L Laxton
(74) *Attorney, Agent, or Firm* — Cermak Nakajima LLP; Tomoko Nakajima (57) ABSTRACT

A bipolar pulsed power supply is provided in which, while effectively restricting the rise in current at the time of arcing which directly leads to the generation of splashes and particles, the occurrence of overvoltage at the time of polarity reversal is prevented. The power supply has a bridge circuit constituted by switching elements SW1 through SW4 connected to positive and negative DC outputs from a DC power supply source. The operation of the switching elements is controlled to output in a bipolar pulsed mode at a predetermined frequency to a pair of electrodes which come into contact with a plasma. There is provided an output-characteristics-switching circuit which switches the output such that, when outputting to the electrodes, the output to the electrodes has initially constant-voltage characteristics and subsequent output to the electrodes has constant-current characteristics.

14 Claims, 8 Drawing Sheets

BIPOLAR PULSED POWER SUPPLY AND POWER SUPPLY APPARATUS HAVING PLURALITY OF BIPOLAR PULSED POWER SUPPLIES

This application is a national phase entry under 35 U.S.C. §371 of PCT Patent Application No. PCT/JP2009/059271, filed on May 20, 2009, which claims priority under 35 U.S.C. §119 to Japanese Patent Application No. 2008-137077, filed May 26, 2008, both of which are incorporated by reference.

TECHNICAL FIELD

The present invention relates to a bipolar pulsed power supply for supplying power to a plasma- and surface-processing apparatus, and also relates to a power supply apparatus having a plurality of bipolar pulsed power supplies.

BACKGROUND ART

This kind of bipolar pulsed power supply is used, for example, in a sputtering apparatus for forming a predetermined thin film on the surface of a substrate to be processed. There is known one which comprises: a rectifying circuit for supplying DC power; and a MOSFET bridge circuit which is connected to positive and negative outputs and is made up of four switching elements. Each of the switching elements is appropriately operated by a control means so that, by alternately switching the polarity at a predetermined frequency, an arbitrary pulsed voltage is applied to a pair of targets which are output ends (electrodes). By thus switching the target alternately to anode electrode and cathode electrode, glow discharge is caused to be generated between the anode electrode and the cathode electrode. A plasma atmosphere is thus formed to thereby sputter each of the targets. According to this arrangement, there is an advantage in that the electric charges to be accumulated on the surface of the targets are canceled when the voltage of opposite phase is applied, thereby obtaining a stable electric discharge (see, e.g., patent document 1).

It is known that, in this kind of glow discharge, arcing (anomalous electric discharge) takes place by unknown causes. When arcing occurs, the impedance on the side of the plasma load rapidly decreases, and a sudden voltage drop takes place, with the resultant increase in current. In case the target is of metallic make, especially of aluminum and the like, when arcing of high arc current value locally takes place between targets, the particles or splashes (particles of several μm to several hundreds μm) to be generated by melting and emission of the targets will take place, thereby impairing good film forming.

In view of the above points, the bipolar power supply as described in the above-mentioned patent document 1 is provided with a detection circuit which detects an output current from a bridge circuit, and an inductor which restricts the increase in current at the time of occurrence of arcing. When the output current as detected by this detection circuit has exceeded a steady output current value, the switching element in operation is switched to thereby once cut off the output to the electrode. Once the overcurrent has calmed down so that the value becomes close to the steady output current value, the output to the electrode is resumed. In this case, when the output current varies beyond a certain range, it is taken or recognized as a pre-stage phenomenon (micro-arc) of arcing so that, by performing the process of extinguishing the arcing, the occurrence of arcing which is large in the amount of current change can be suppressed.

If the output from the DC power supply source has constant-voltage characteristics, the capacity component (capacitance) becomes dominant over the inductance components. Therefore, at the time of occurrence of arcing, as a result of decrease in the impedance on the side of the plasma load (depending on cases, the impedance becomes several ohms or less), the output and the plasma (load) are coupled together so that the capacitance will rapidly be discharged to the output side. As a result, there is a problem in that, even if an inductor of a small inductance value is provided, the increase in current cannot be suppressed efficiently and therefore that overcurrent flows in a short period of time (for several μs) which means that the rate of increase in current per unit time at the time of arcing is high.

In case the rate of increase in current per unit time is high, even in case micro-arc processing is performed by taking advantage of a relatively small state of current change amount, there are cases where large arc current flows within a time from the time of detection of arcing based on the change in current which takes place behind the voltage change to the time of shut off of the power supply to the plasma. The arc energy to be emitted becomes large (about two times of the current of the steady current value flows) and splashes and particles tend to be generated. Especially, when the arcing takes place in succession, the occurrence of splashes and particles cannot be substantially suppressed.

On the other hand, if there is provided an inductor of an inductance value which is larger by one digit than the inductance component of the plasma, the output from the DC power supply source becomes a constant-current characteristic, so that the rate of increase in current per unit time at the time of occurrence of arcing will be limited. However, when each of the switching elements of the bridge circuit is switched, there are cases where a higher voltage than the ordinary discharge voltage is generated. In other words, as a result of occurrence of inductance components in the plasma, overvoltage takes place at the time of polarity reversal in each of the targets. Once overvoltage occurs in this manner, there is a possibility of inducing arcing.

Patent Document 1: Japanese Patent No. 3639605

DISCLOSURE OF THE INVENTION

Problems to be Solved by the Invention

In view of the above-mentioned points, this invention has a problem of providing a bipolar pulsed power supply and also a power supply apparatus having a plurality of bipolar pulsed power supplies, which are arranged to effectively limit the increase in current at the time of arcing leading directly to the occurrence of splashes and particles, and which also prevent the overvoltage from taking place at the time of polarity reversal.

Means for Solving the Problems

In order to solve the above-mentioned problems, the bipolar power supply according to this invention comprises a bipolar pulsed power supply comprising a bridge circuit made up of switching elements connected to positive and negative DC outputs from a DC power supply source so that, by controlling an operation of the switching elements, output is made, in a bipolar pulsed mode at a predetermined frequency, to a pair of electrodes that come into contact with a plasma. The bipolar pulsed power supply has an output characteristics switching circuit that switches the output when outputting to the electrodes such that the output to the electrodes has initially constant-voltage characteristics and that the output to the electrodes has thereafter constant-current characteristics.

According to this invention, by providing the output characteristics switching circuit, in case arcing takes place for one cause or another, an abrupt voltage drop occurs due to a rapid reduction in plasma impedance, with a resultant increase in current. At this time, since the output from the DC power supply source to the electrodes has constant-current characteristics, there will be limited the rate of rise in electric current per unit time at the time of occurrence of arcing. On the other hand, since the output is in constant-voltage characteristics only at the time of polarity reversal in each of the electrodes, the overvoltage will be prevented from occurring at the time of polarity reversal, with the result that the occurrence of arcing due to the overcurrent will be suppressed.

According to this invention, preferably, the output characteristics switching circuit comprises: an inductor which is disposed in at least one of the positive and the negative DC outputs from the DC power supply source to the bridge circuit; and another switching element connected in parallel with the inductor, such that, at an initial time of switching of the switching elements, said another switching element is operated for a predetermined period of time to thereby short-circuit the inductor. By employing the above-mentioned arrangement, there can be easily materialized a constitution of switching from the constant-voltage characteristics to the constant-current characteristics. In this case, the timing of said another switching the switching element can be appropriately set depending on the volume in which the plasma is generated (i.e., the plasma impedance). In addition, at the time of micro-arc processing, the switching element is controlled to be OFF so that the rate of rise in electric current can be limited at the time of arcing.

On the other hand, preferably, the output characteristics switching circuit comprises: an inductor which is disposed in at least one of the positive and negative DC outputs from the DC power supply source to the bridge circuit; and a diode which is connected in series with the inductor such that the inductor is short-circuited at a time of occurrence of an overvoltage. During the time when an overvoltage is taking place at the time of polarity reversal, the diode will be in a state of ON and the inductor is short-circuited. Therefore, only during that time, the output will be of constant-voltage characteristics. According to this arrangement, since there is used no switching element that requires control over the switching, the circuit constitution and its control can advantageously be simplified.

According to this invention, preferably a resistor is connected in series with said another switching element or the diode. The switching element and the diode may thus be protected from an overvoltage that occurs at the time of polarity reversal.

In this invention, the electrodes may especially be effective when they are a pair of targets disposed in a vacuum chamber in which sputtering method is carried out.

Further, in order to solve the above-mentioned problems, the power supply apparatus according to this invention comprises a plurality of bipolar pulsed power supplies according to any one of claims 1 through 5, the power supplies being connected in parallel with each other, wherein each of the bipolar pulsed power supplies is synchronized so as to output power in a bipolar pulsed mode to at least a pair of electrodes disposed in a same processing chamber.

BEST MODE FOR CARRYING OUT THE INVENTION

Figure 1:
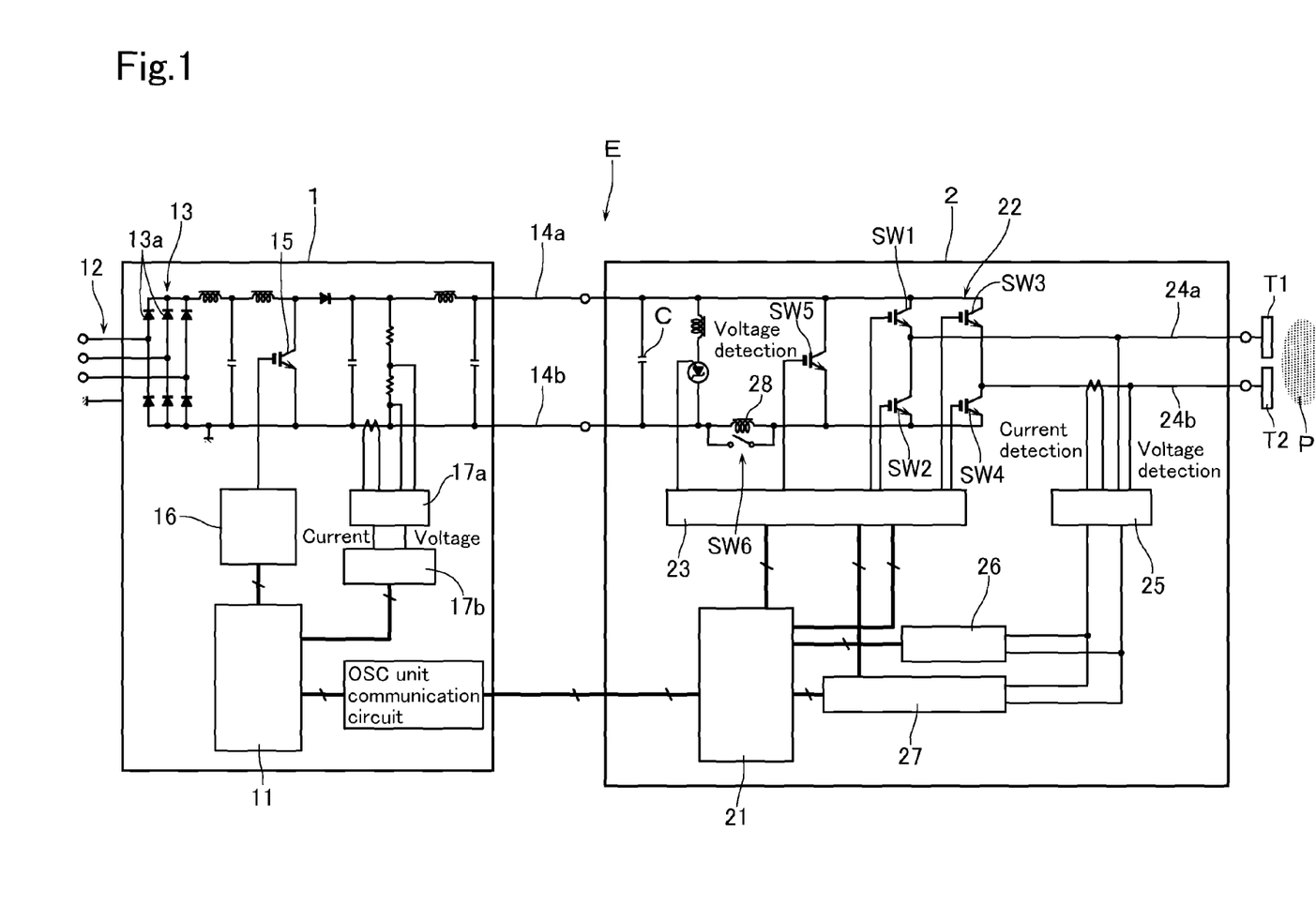
FIG. 1 is a block diagram schematically showing an arrangement of a bipolar pulsed power supply of this invention.

A description will now be made of a bipolar pulsed power supply E with reference to the accompanying drawings. As shown in FIG. 1, the bipolar pulsed power supply E is disposed opposite to a substrate to be processed e.g., inside a sputtering apparatus, and is used to supply electric power (output) to a pair of targets T1, T2 which are electrodes coming into contact with a plasma P, the electric power being supplied in a bipolar pulsed mode at a predetermined frequency. The bipolar pulsed power supply E is made up of a DC power supply unit 1 which enables to supply DC power, and an oscillation unit 2 which controls the output to each of the targets T1, T2. The waveform of the output voltage may be substantially rectangular or substantially sinusoidal.

The DC power supply unit 1 has: a first CPU circuit 11 which controls the operation of the DC power supply unit; an input part 12 which receives an input of commercial AC power supply (three-phase AC 200V or 400V), and a rectifying circuit 13 which has six diodes 13a to rectify the inputted AC power to convert it into DC power. Through positive and negative DC power lines 14a, 14b, DC power is outputted to the oscillation unit 2. The DC power supply unit 1 is provided with: a switching transistor 15 which is disposed between DC power lines 14a, 14b; and a driver circuit 16 which is connected to the first CPU circuit 11 in a manner capable of communication therewith so as to control the ON or OFF of the switching transistor 15. Between the DC power lines 14a, 14b, there is connected a detection circuit 17a which detects the current and voltage thereof. The current and voltage detected by the detection circuit 17a are arranged to be inputted to the first CPU circuit 11 through the AD converter circuit 17b.

The oscillation unit 2 is provided with: a second CPU circuit 21 which is connected to the first CPU circuit 11 in a manner capable of communication therewith; a bridge circuit 22 which is made up of first through fourth, a total of four, switching transistors SW1 through SW4 which are connected to the positive and negative DC power lines 14a, 14b; and a driver circuit 23 for output oscillation to control the ON or OFF switching of each of the switching transistors SW1 through SW4, the driver circuit being connected to the second CPU circuit 21 in a manner capable of communication therewith.

When control is made of the switching of each of the switching transistors SW1 through SW4 so that, by the driver circuit 23 for output oscillation, the ON-OFF timing can be reversed, e.g., between the first and the fourth switching transistors SW1, SW4, and the second and third switching transistors SW2, SW3, output is made to a pair of targets T1, T2 in a bipolar pulsed mode through output lines 24a, 24b from the bridge circuit 22. To the output lines 24a, 24b there is connected a detection circuit 25 which detects an output current and an output voltage to the pair of targets T1, T2. The output current and the output voltage detected by this detection circuit 25 is arranged to be inputted to the second CPU circuit 21 through an AD converter circuit 26.

In the above-mentioned bipolar pulsed power supply E, if each of the switching transistors SW1 through SW4 is switched in a state in which the DC power is being outputted from the DC power supply unit 1, their switching losses will become large. Therefore, it is necessary to arrange that the durability of each of the switching transistors SW1 through SW4 is improved. As a solution, the following arrangement has been made. A switching transistor SW5 for short-circuiting the output (also called "output-short-circuiting switching transistor") whose ON-OFF switching is controlled by the driver circuit 23 for output oscillation, is provided between the positive and the negative DC output lines 14a, 14b from the DC power supply unit 1. In a state of short-circuiting of the output-short-circuiting switching transistor SW5 (i.e., in a state in which the output to the targets T1, T2 is cut off), the switching of each of the switching transistors SW1 through SW4 in the bridge circuit 22 can be made.

Figure 2:
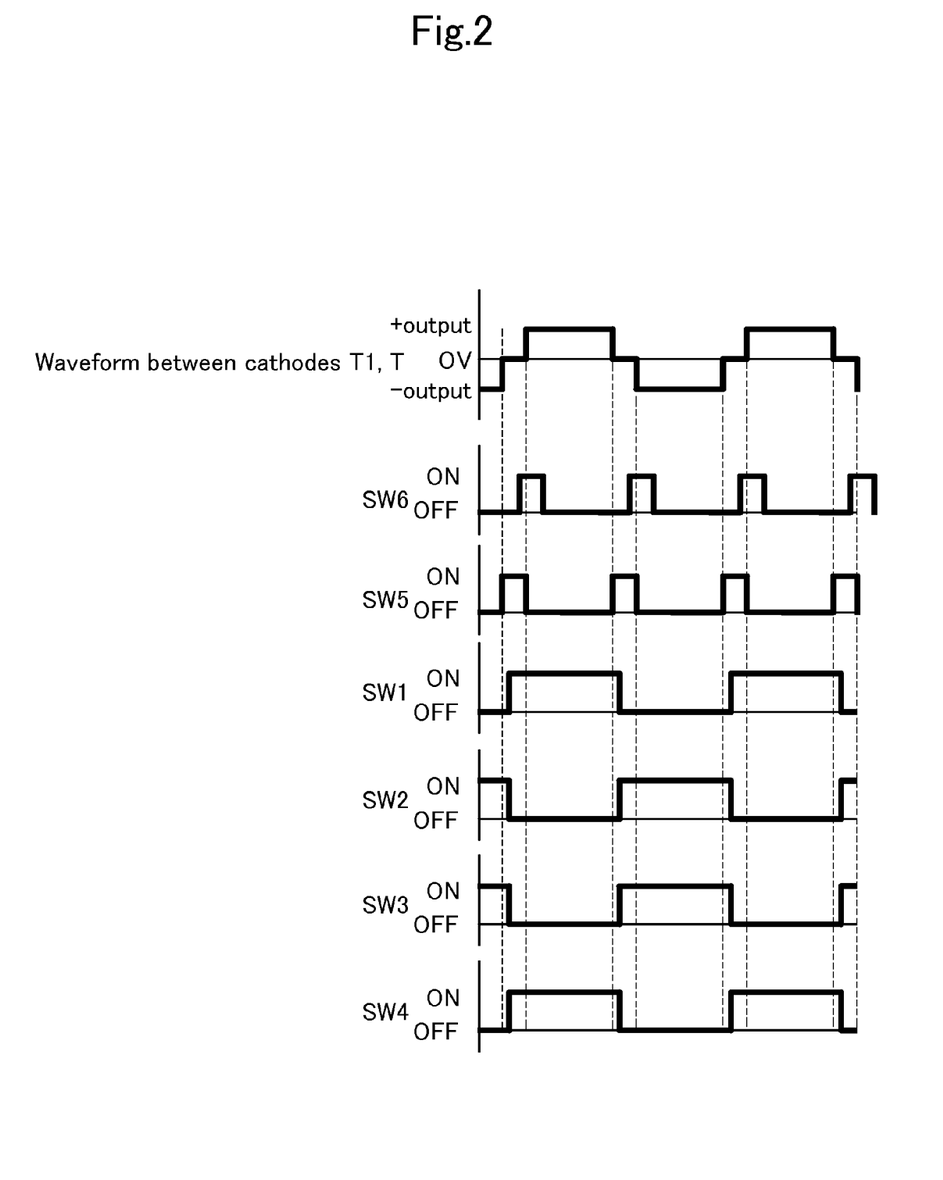
FIG. 2 is a diagram showing an output control of bipolar pulsed power supply of this invention.

In other words, as shown in FIG. 2, when output is made to a pair of targets T1, T2 in a bipolar pulsed mode, in a short-circuited state (ON) of the switching transistor SW5, the first and the fourth switching transistors SW1, SW4, e.g., are switched on. Thereafter, the short-circuiting of the switching transistor SW5 is released (OFF), and output is made to one T1 of the targets (negative potential is applied to target T1). Subsequently, the switching transistor SW5 is once again short-circuited, and the first and the fourth switching transistors SW1, SW4 are switched off, and also the second and the third switching transistors SW2, SW3 are switched on. Thereafter, the switching transistor SW5 is switched off, and output is made to the other T2 of the targets (negative potential is applied to target T2).

By repeating the above-mentioned control in which the ON-OFF timing of each of the switching transistors SW1 through SW4 is reversed, output is made in a bipolar pulsed mode to the pair of targets T1, T2 at a predetermined frequency. At this time, in a state in which a sputtering gas such as Ar, and the like is introduced into the apparatus that is held at a predetermined pressure, the targets T1, T2 that are charged with electric power at a predetermined frequency while alternately changing the polarity, are alternately switched to anode electrode and cathode electrode. Glow discharge is thus caused to occur between the anode electrode and the cathode electrode thereby forming a plasma atmosphere, and sputtering is performed in each of the targets T1, T2.

According to this arrangement, the switching loss that occurs at the time of outputting to the targets T1, T2 occurs only at the switching transistor SW5, and there occurs little or no switching loss to each of the switching transistors SW1 through SW4. As a result, without using high-performance switching elements, a high durability can be attained. Further, there will be required no sufficient heat radiating mechanism that would otherwise be required in the case in which the switching losses occur at the four switching elements, thereby attaining a reduction in cost.

Figure 3:
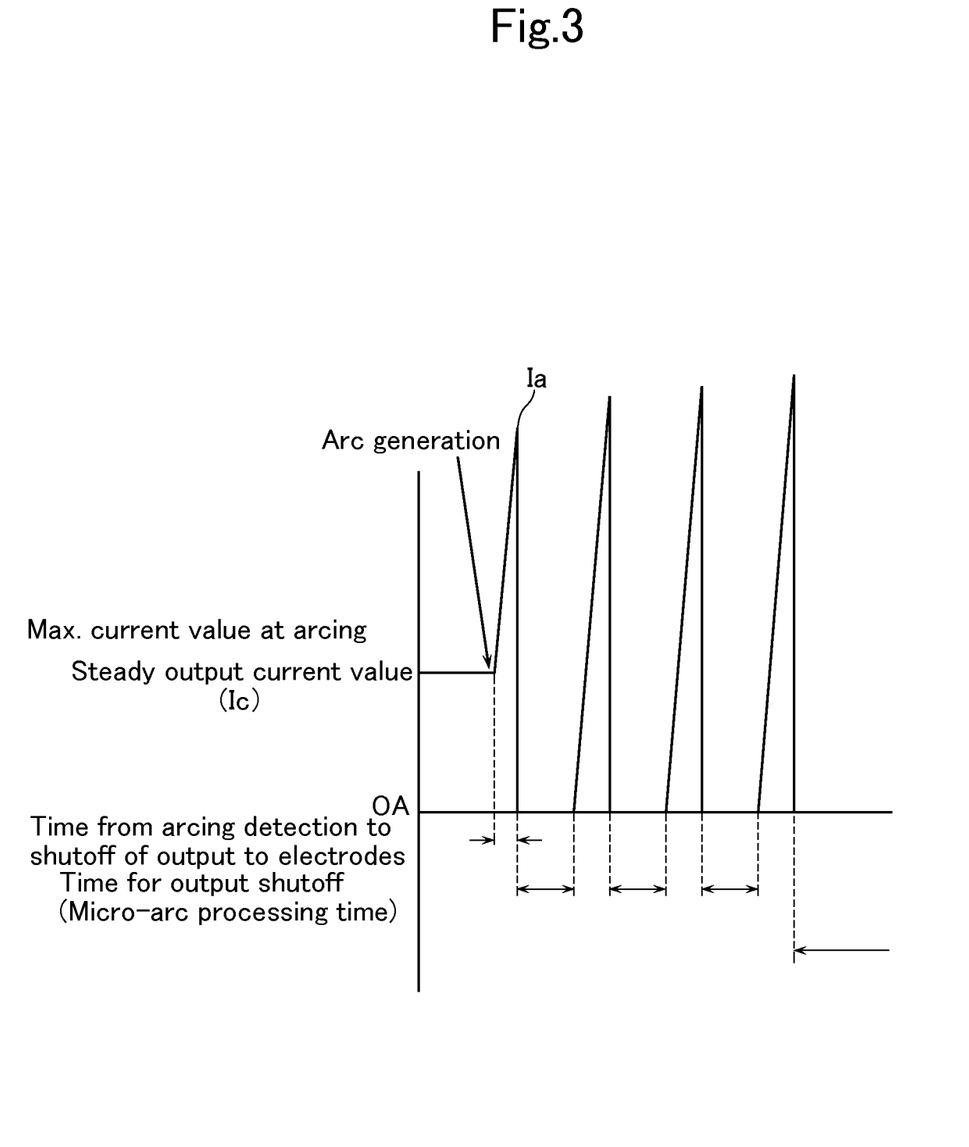
FIG. 3 is a diagram showing a current change at the time of micro-arc processing at a conventional bipolar pulsed power supply.

If the output from the DC power supply unit 1 is of constant-voltage characteristics, the capacity component (capacitance) becomes dominant over inductance component. In case the capacity component (capacitance) is dominant, due to the fact that the impedance on the side of plasma load becomes small, the output and the plasma load will be coupled together so that the capacitance component will be rapidly discharged to the output side. Therefore, within the time from the detection of arcing by the detection means to the cut off of output to the electrodes, a large arc current flows. As a result, if the arcing cannot be extinguished in a single operation, the arc current value gets larger and larger each time the micro-arc processing is performed (arc energy to be discharged becomes larger), whereby splashes and particles become easier to occur (see FIG. 3).

As a solution, an arrangement has been made that an inductor 28 having a larger inductance value than the inductance component of plasma is provided in the negative DC output line 14b (see FIG. 1). In case the rate of current rise at the time of micro-arc processing is limited below 200% of the steady current value, more preferably below 150%, the rate of rise ($\Delta i$) in output current at the time of occurrence of arcing is given by $\Delta i = \Delta t \cdot V/L$
where L is the inductance value of the inductor 28, V is the output voltage to the targets T1, T2, and $\Delta t$ is the time of current change. At this time, on condition that the output voltage to the pair of targets T1, T2 is 500 V, the output current is 100 A, and the time of micro-arc processing (output cut off) is 200 µs to thereby make the rate of rise of current to be 150% until the overcurrent is detected and the output is cut off, $\Delta i$ becomes 50 A. In this kind of case, the inductor 28 having an inductance value of 2 mH may be connected to the negative DC output line 14b. In this embodiment, an arrangement has been made that the negative DC output line 14b is provided with the inductor 28 of a predetermined value. The position of connecting the inductor 28 is not limited to the above-mentioned example. It may be disposed in the positive DC output line 14a or in both the positive and the negative DC output lines 14a, 14b, respectively.

Figure 4:
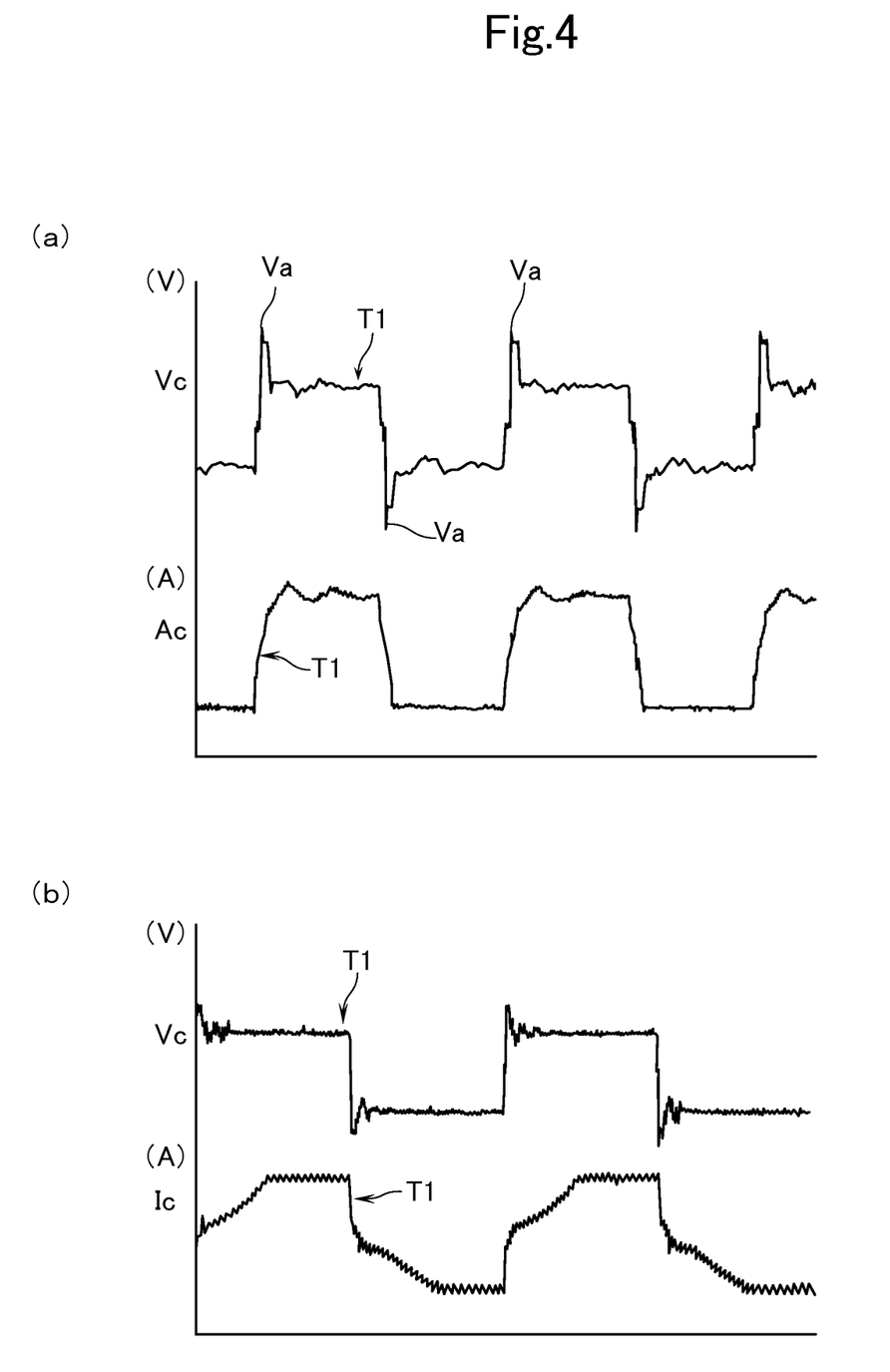
FIGS. 4(a) and 4(b) are diagrams showing waveforms of output voltage and output current to a pair of electrodes.

In case there is provided an inductor 28 having, e.g., a value of 2 mH, there will be generated a voltage Va which is higher than an ordinary discharge voltage Vc when each of the switching elements SW1 through SW4 is switched at a predetermined frequency (e.g., at 5 kHz) (see FIG. 4(a)). In other words, inductance component is generated in the plasma P, and overcurrent occurs whenever the outputs to the pair of targets T1, T2 are alternately switched (at the time of polarity reversal). When overvoltage takes place in this manner, there is a possibility that arcing will be induced. It is to be noted that FIG. 4 shows only the changes in the output voltage and the output current at one T1 of the targets.

Therefore, it is so arranged that the positive and the negative DC lines from the DC power supply unit 1 are provided with an output characteristics switching circuit having the above-mentioned inductor 28 and another switching element SW6 which is connected in parallel with the inductor 28 (see FIG. 1). The switching element SW6 has a known construction such as FET and the like, and the switching ON or OFF thereof is controlled by the driver circuit 23. Further, in order to protect the switching element SW6 at the time of preventing the overvoltage, there may be employed an arrangement in which a resistor (not illustrated) having a resistance value, e.g., of several ohms ($\Omega$) to several hundred ohms ($\Omega$) is connected in series with the switching element SW6.

In a short-circuited state (ON) of the switching transistor SW5, when, for example, the first and the fourth switching transistors SW1, SW4 are switched on, and thereafter the short-circuiting of the switching transistor SW5 is released (OFF) so that output is made to one T1 of the targets, the inductor 28 is short-circuited by keeping the switching element SW6 switched on for a predetermined period of time. Then, the switching transistor SW5 is short-circuited again, the first and the fourth switching transistors SW1, SW4 are switched off, the second and the third switching transistors SW2, SW3 are switched on, and then after having switched off the switching transistor SW5, the switching element SW6 is kept switched on for a certain period of time, whereby the inductor 28 is short-circuited (see FIG. 2). Setting may be made appropriately depending on the timing of switching of the switching element SW6 (time for switching ON the switching element SW6), and the volume of space for a plasma to occur (i.e., impedance of a plasma). At the time of micro-arc processing, which is described hereinafter, the switching element SW6 is controlled to be switched OFF so as to limit the rate of current rise at the time of occurrence of arcing.

In this manner, by operating the switching element SW6 at the time of polarity reversal to thereby short-circuit the inductor 28 only for a predetermined period of time, the output to the targets T1, T2 will be of constant-voltage characteristics during the time in which the inductor 28 is short-circuited. The output current Ic will gradually be increased (i.e., the output current will be a ramp output starting from zero Ampere). When the switching element SW6 is returned to the switched-off state, it will become of constant-current characteristics. An overvoltage is thus prevented from taking place at the time of polarity reversal at each of the targets T1, T2 whereby the occurrence of arcing attributable to overcurrent can be restrained (see FIG. 4(b)).

A description will now be made of an arc processing at the bipolar pulsed power supply according to this invention. In other words, during the above-described glow discharge, there are cases where arcing may take place for one cause or another. Once arcing has occurred, impedance on the side of plasma load becomes rapidly small. Therefore, a rapid voltage drop takes place and, accompanied thereby, the current will increase. In view of the above, there is provided an arc detection control circuit 27 which receives an input of the output current and the output voltage detected in the detection circuit 25, in a manner capable of communication with the second CPU circuit 21 (see FIG. 1). When the output current varies beyond a certain range in case the output to the targets T1, T2 is of constant-voltage characteristics, or when the output voltage varies beyond a certain range of the specified voltage in case the output voltage to the targets T1, T2 has constant-current characteristics, it is taken or recognized as a pre-stage phenomenon of arcing (micro-arc). Then, by performing the processing of extinguishing the arcing, the occurrence of arcing of the large arc current is suppressed.

A description will now be made with reference to FIGS. 5 and 6. When the output current Ia detected by the detection circuit 25 has exceeded the steady output current value Ic, or when the output voltage becomes smaller than the designated voltage (not illustrated), the arc detection control circuit 27 will take it as a pre-stage phenomenon, and the output-short-circuiting switching transistor SW5 will be short-circuited (ON) by the driver circuit 23 for output oscillation through the second CPU circuit 21 and the arc detection control circuit 27. At this time, since the DC output line 14b is provided with the inductor 28, the output from the DC power supply unit 1 will become of constant-current characteristics, and the rate of current rise at the time of occurrence of arcing will be limited. When the output-short-circuiting switching transistor SW5 is short-circuited (ON), each of the switching transistors SW1 through SW4 of the bridge circuit 22 is held in the state of being outputted to either of the targets T1, T2. However, as a result of short-circuiting of the switching transistor SW0, the output to the targets T1, T2 will be cut off (micro-arc processing).

Then, after a lapse of a predetermined period of time (several μs to several ms), the short-circuiting of the output-short-circuiting switching transistor SW5 is released (OFF), and the output to either of the targets T1, T2 will be resumed depending on the operating conditions of each of the switching transistors SW1 through SW4. At this time, as a result of switching ON of the switching element SW6 for a certain period of time, the inductor 28 will be short-circuited. In the same manner as mentioned above, while the inductor 28 is being short-circuited, the output to the targets T1, T2 will become of constant-voltage characteristics. As a result, at the time of resuming the outputting to one of the targets T1, T2, an overvoltage is prevented from taking place. The arc detection control circuit 27 makes judgment as to whether the output current Va has exceeded the steady output current value Vc or not, or as to whether the output voltage has become smaller than a specified voltage or not. If the output voltage is still exceeding the steady output current value Vc or if the output voltage is smaller than the specified voltage, the driver circuit for output oscillation 23 operates to short-circuit once again the output-short-circuiting switching transistor SW5.

In case the output current Ia remains to be in a state of having exceeded the output current value Ic, or in case the output current Ia has exceeded a specified value that is set in advance, despite the repeating for several times of a series of micro-arc processing operations, judgment is made that arcing inducing the generation of splashes and particles will take place. Then, by means of the control from the first CPU circuit 11, the switching transistor 15 is switched off to thereby stop the output from the DC power supply unit 1 (hard arc processing). During this processing, too, the arc energy to be discharged can be made small, and the generation of the splashes and the particles can be effectively suppressed as a result of combined effects in: that the arc current value is maintained smaller than 200% of the steady current value (see FIG. 6); and that, as compared with the case in which two switching transistors SW1 through SW4 that are being outputted are switched to perform the extinction processing of the arcing, the control of output cut-off can be performed at a better response. During this processing, since there will occur little or no switching loss to each of the switching transistors SW1 through SW4 in the bridge circuit 22, the durability thereof can further be improved.

In this embodiment, a description has been made of an example in which the inductor 28 and the switching element SW6 are disposed as an output characteristics switching circuit in which, at the time of outputting by the bipolar pulsed power supply E to the targets T1, T1 as electrodes (inclusive of the case of resuming output at the time of micro-arc processing), the output to each of the electrodes has steady voltage characteristics and thereafter switches so that the output to each of the electrodes has steady current characteristics. This invention is, however, not limited thereto.

For example, in place of the switching elements such as FETs and the like, there can be employed an arrangement in which a diode (not illustrated) for short-circuiting the inductor 28 at the time of occurrence of overvoltage, is connected in parallel with the inductor 28, thereby forming an output characteristics switching circuit. According to this arrangement, output characteristics switching circuit can be materialized in a simple arrangement. In addition, the control can advantageously be eliminated unlike the case in which control is required when switching element is employed. In this case, the output characteristics switching circuit may be constituted by an output clamp circuit which is made up of a capacitor C connected to the positive and the negative DC output lines 14a, 14b from the DC power supply unit 1; and a diode D and a resistor R both being connected in series with each other but in parallel with the inductor 28. As the capacitor C there may be used one having 5 to 20 μF and as the resistor R there may be used one having a range of several ohms (Ω) to 10 ohms (Ω).

Figure 7:
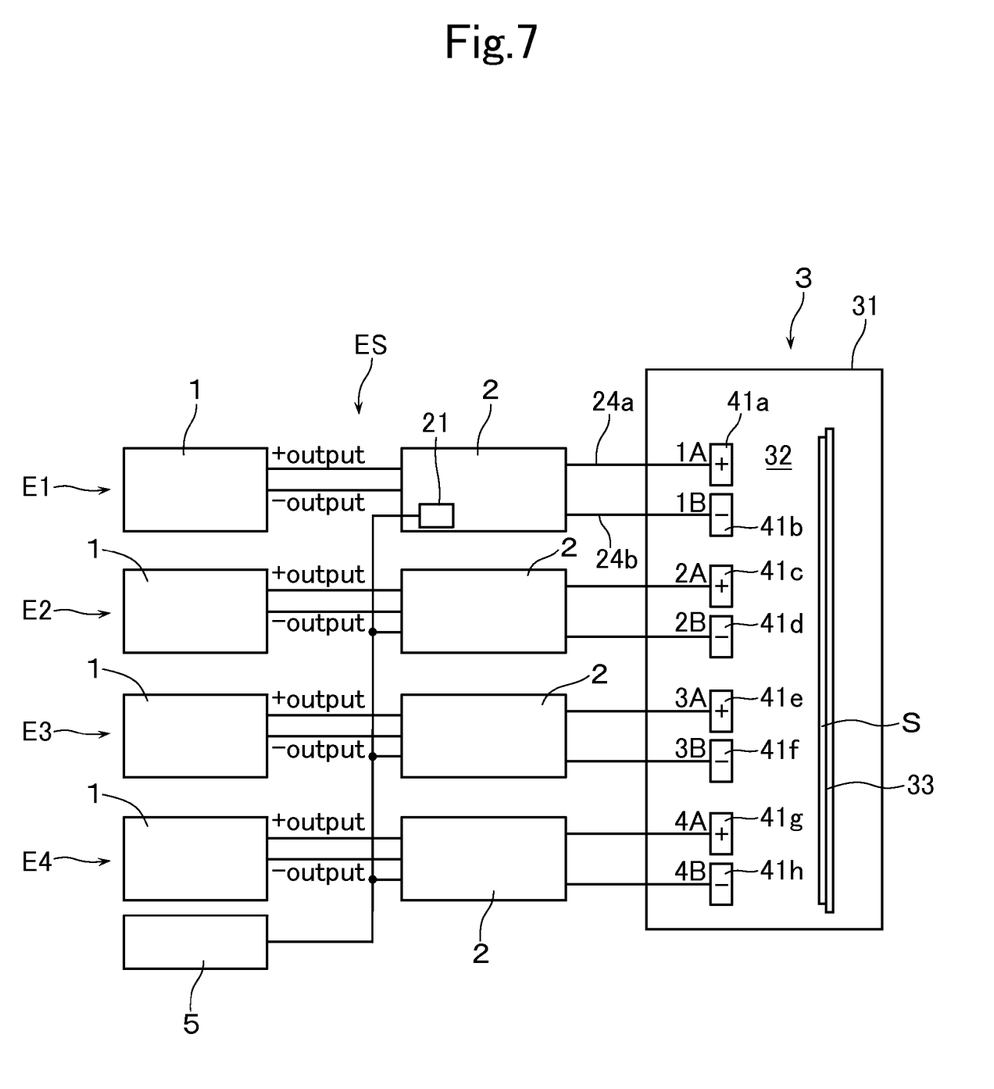
FIG. 7 is a block diagram schematically showing an arrangement of a sputtering apparatus using the power supply apparatus of this invention.
Figure 8:
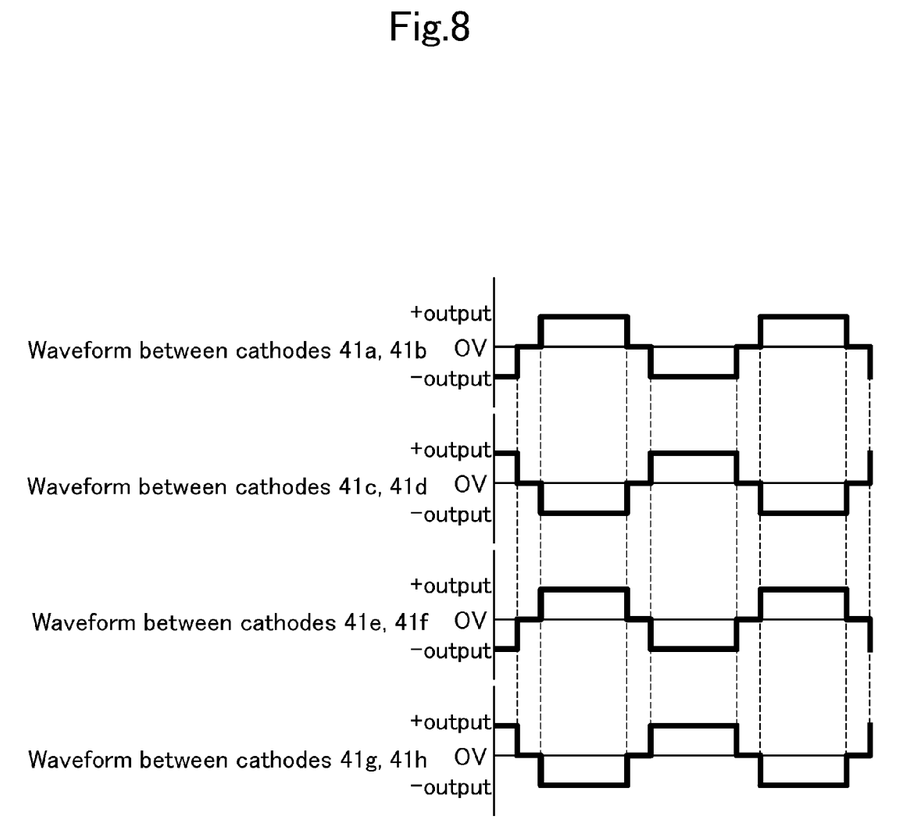
FIG. 8 is a diagram showing an output control of the power supply apparatus of this invention.

With reference to FIGS. 7 and 8, a description will now be made of a power supply apparatus which is made up by combining a plurality of bipolar pulsed power supplies E in parallel with each other. Reference character ES denotes the power supplies according to this invention. These power supplies ES are used, e.g., in a magnetron sputtering apparatus (hereinafter referred to as "sputtering apparatus") 3 having the following arrangement.

The sputtering apparatus 3 has a vacuum chamber 31 which can hold the pressure at a predetermined vacuum pressure (e.g., $10^{-5}$ Pa) through an evacuating means such as a rotary pump, a turbo-molecular pump and the like, the vacuum chamber constituting a sputtering chamber (processing chamber) 32. On an upper part of the vacuum chamber 31 there is provided a substrate holder 33 which holds, in a potentially floating state, a large-area substrate S to be processed which is used in manufacturing, e.g., FPD. The vacuum chamber 31 is also provided with a gas introduction pipe (not illustrated) for introducing a process gas into the sputtering chamber 32. At the time of forming a predetermined thin film in reactive sputtering, there can be introduced into the processing chamber 32: a sputtering gas made from a rare gas such as Ar and the like; and a reactive gas such as $O_2$, $N_2$, $H_2O$ and the like to be appropriately selected depending on the composition of a thin film to be formed on a surface of the substrate S to be processed.

In the sputtering chamber 32 there are disposed a plurality of (8 in this embodiment) targets 41a through 41h at an equal distance from one another opposite to the substrate S to be processed. Each of the targets 41a through 41h is manufactured, in a known method, of Al, Ti, Mo, oxides of indium and tin (ITO), an alloy of indium and tin, and the like depending on the composition of the thin film to be formed on the surface of the substrate S to be processed. The targets are formed into the same shape such as substantially into a rectangular parallelepiped (rectangle as seen in plan view).

Each of the targets 41a through 41h is combined through a bonding material such as indium, tin, and the like, to a backing plate which cools the targets 41a through 41h during sputtering. Each of the targets 41a through 41h is disposed in the vacuum chamber 31 through an insulating material such that the sputtering surface before use is positioned on the same plane parallel with the substrate S to be processed. On a rear side of the targets 41a through 41h (on the side which lies opposite to the sputtering surface), there is disposed a magnet assembly (not illustrated) having a known construction. By capturing the electrons ionized in front of each of the targets 41a through 41h, and the secondary electrons generated by the sputtering, the density of electrons is enhanced in front of each of the targets 41a through 41h, thereby increasing the sputtering rate.

Each of the targets 41a through 41h is arranged to make a pair out of the adjoining two (41a and 41b, 41c and 41d, 41e and 41f, 41g and 41h). The bipolar pulsed power supplies E1 through E4 according to the embodiment of this invention are respectively assigned to the pairs of targets 41a through 41h. The output lines 24a, 24b from the bipolar pulsed power supplies E1 through E4 are connected to the respective pairs of targets 41a, 41b (41c and 41d, 41e and 41f, 41g and 41h). According to this arrangement, it becomes possible to supply each pair of the targets 41a through 41h with power whose polarity is alternately bipolar pulsed.

Figure 5:
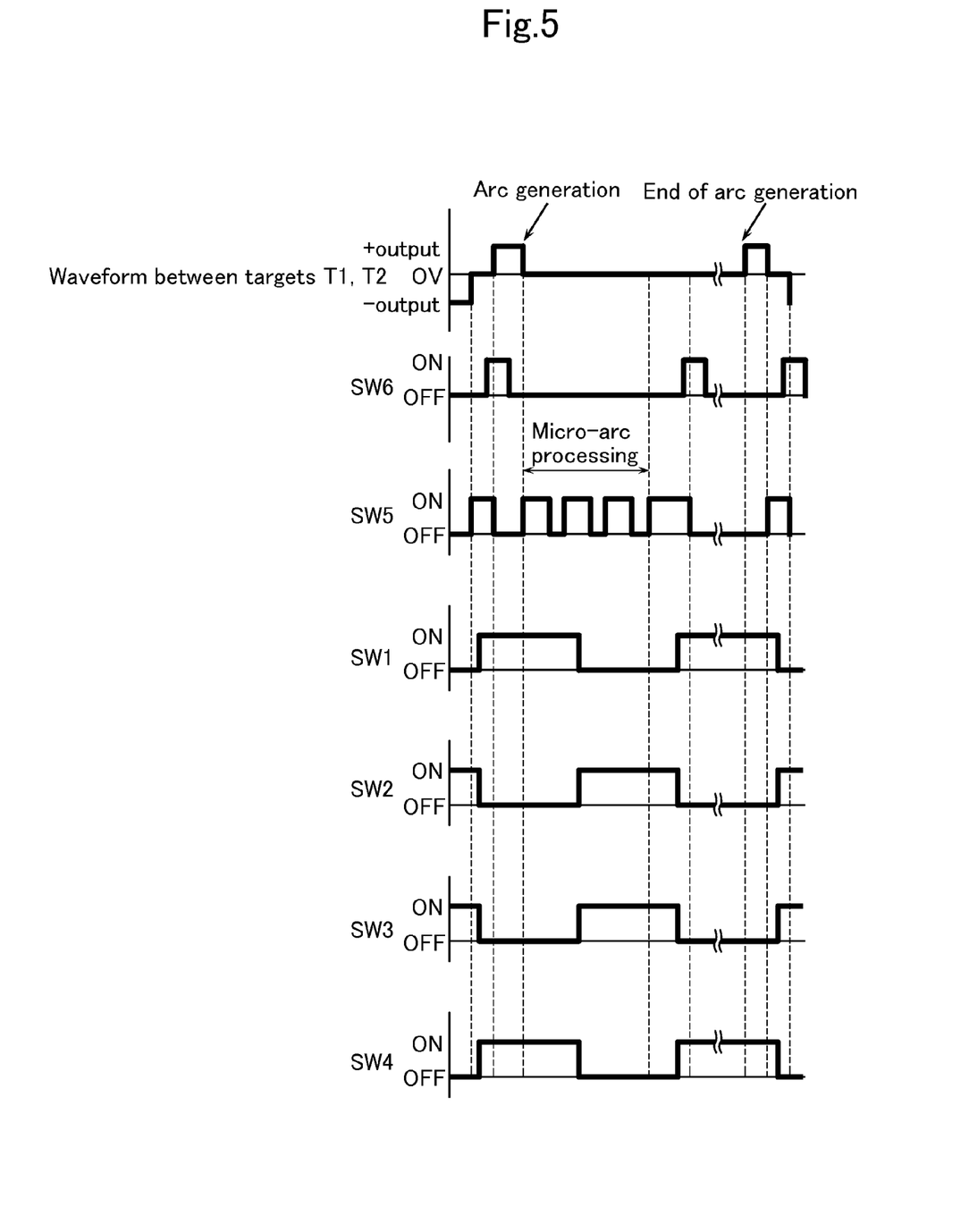
FIG. 5 is a diagram showing a micro-arc processing at the bipolar pulsed power supply of this invention.
Figure 6:
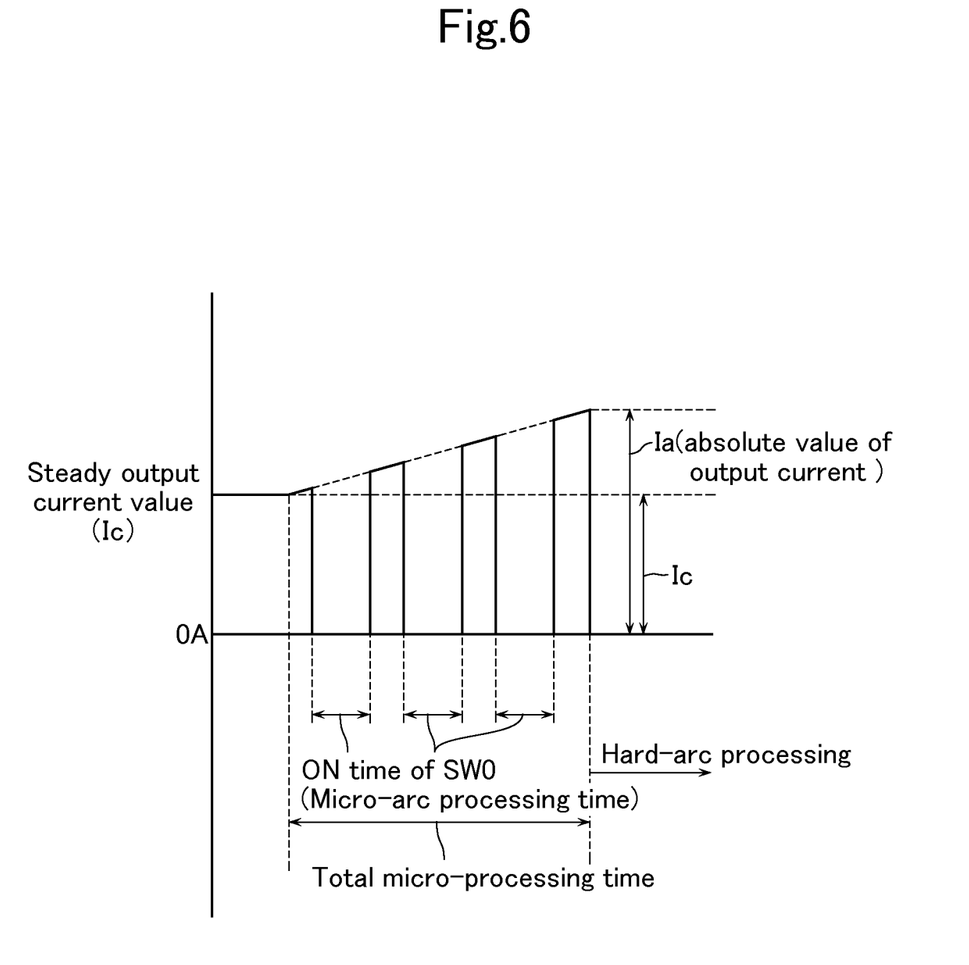
FIG. 6 is a diagram showing a change in current at the time of micro-arc processing at the bipolar pulsed power supply of this invention.

In this embodiment, in order to stably generate a plasma in front of the targets 41a through 41h, the power is supplied with each of the bipolar pulsed power sources E1 through E4 that are synchronized with each other so that the polarity of mutually adjoining targets 41a through 41h reverses relative to each other (see FIG. 5). For this synchronized operation there is provided a central control means 5 which is made up of a CPU connected in a manner capable of communication with the second CPU circuit 21 of each of the bipolar pulsed power supplies E1 through E4.

Then, in a short-circuited state of the output-short-circuiting switching transistor SW5 of each of the bipolar pulsed power supplies E1 through E4, each of the switching transistors SW1 through SW4 is operated so that the ON-OFF timing is reversed between the first and the fourth switching transistors SW1, SW4 and the second and the third switching transistors SW2, SW3, and so that the polarity of the mutually adjoining targets 41a through 41h is reversed. Thereafter, the short-circuiting of the switching transistor SW5 is released by the output from the central control means 5 so that output is made, out of a pair of targets, to one respective targets 41a, 41c, 41e, 41g.

Thereafter, by means of an output from the central control means 5, the output-short-circuiting switching transistor SW5 of each of the bipolar pulsed power supplies E1 through E4 is short-circuited. After switching each of the transistors SW1 through SW4, the short-circuiting of the switching transistor SW5 is released by the output from the central control means, and output is made to each of the other 41b, 41d, 41f, 41h of the targets. By thus repeating the above-mentioned control, each of the targets 41a through 41h is provided with power in a bipolar pulsed mode at a predetermined frequency, thereby performing synchronized operation.

At the time of this synchronized operation, it is necessary for the central control means 5 only to synchronize the timing of ON-OFF switching of the output-short-circuiting switching element SW5 of each of the bipolar pulsed power supplies E1 through E4. Therefore, the switching elements SW1 through SW4 of each of the bipolar pulsed power supplies E1 through E4 can be operated with sufficient allowance. Even if the switching element of each of the bipolar pulsed power supplies and the control circuit may have individual differences, the synchronized operation thereof is easy.

Further, each of the bipolar pulsed power supplies E1 through E4 is arranged to perform the above-mentioned micro-arc processing in the following manner. In case, during sputtering, the output current Ia as detected by the detection circuit 25 has exceeded the steady output current value Ic in any one of the bipolar pulsed power supplies, the micro-arc processing is performed by the switching of the output-short-circuiting switching transistor SW5 by means of the arc detection control circuit 23 in the bipolar pulsed power supply.

At the time of performing the micro-arc processing in any one of the bipolar pulsed power supplies, if the potential coincides with each other between a pair of targets to which the output cables 24a, 24b from the bipolar pulsed power supplies are connected, and other targets to which the output power cables 24a, 24b from another bipolar pulsed power supply adjacent to the pair of targets are connected, the arcing can be easily extinguished.

In this embodiment, the following arrangement has been employed. In other words, when micro-arc processing is started at any one of the bipolar pulsed power supplies E1 through E4, output is made to the second CPU circuit 21 of the bipolar pulsed power supply which is outputting to the adjoining targets through the central control means 5. In this case, the output-short-circuiting switching transistor SW5 is once short-circuited by the driver circuit 23 for output oscillation, through the second CPU circuit 21. Depending on the operating conditions of each of the switching transistors SW1 through SW4, the timing for operating each of the switching transistors SW1 through SW4 is changed so that the potential coincides with each other. The short-circuiting of the output-short-circuiting switching transistor SW5 is released and output is made to the targets.

In this embodiment, a description has been made of an example in which a central control means is provided in order to perform synchronized operation of each of the bipolar pulsed power supplies. However, an arrangement may be made such that any one of the second CPU circuit 21 is constituted as a central control means (master power supply) and that, by the output of this central control means, the operation of the other bipolar pulsed power supplies E1 through E4 can be controlled. Further, in the above example, a description has been made of an arrangement in which output is made to a pair of targets by one of bipolar pulsed power supplies E1 through E4. This invention may, however, be applied to a case in which output is made to a pair of targets by a plurality of bipolar pulsed power supplies E1 through E4.

DESCRIPTION OF REFERENCE NUMERALS AND CHARACTERS

1 DC power supply unit
2 oscillation unit
22 bridge circuit
24a, 24b output cables
25 output current and voltage detection circuit
27 arc detection control circuit
28 inductor
E bipolar pulsed power supply
SW1 through SW6 switching elements
T1, T2 electrodes (targets)

What is claimed is:

1. A bipolar pulsed power supply comprising a bridge circuit made up of switching elements connected to positive and negative DC outputs from a DC power supply source so that, by controlling an operation of the switching elements, output is made, in a bipolar pulsed mode at a predetermined frequency, to a pair of electrodes that come into contact with a plasma,
wherein the bipolar pulsed power supply has an output characteristics switching circuit that switches the output when outputting to the electrodes such that the output to the electrodes has initially constant-voltage characteristics and that the output to the electrodes has thereafter constant-current characteristics, and
wherein the output characteristics switching circuit comprises:
an inductor which is disposed in at least one of the positive and the negative DC outputs from the DC power supply source to the bridge circuit; and
another switching element connected in parallel with the inductor, such that, at an initial time of switching of the switching elements, said another switching element is operated for a predetermined period of time to thereby short-circuit the inductor.

2. The bipolar pulsed power supply according to claim 1, wherein a resistor is connected in series with said another switching element or the diode.

3. A power supply apparatus comprising a plurality of bipolar pulsed power supplies according to claim 2, the power supplies being connected in parallel with each other, wherein each of the bipolar pulsed power supplies is synchronized so as to output power in a bipolar pulsed mode to at least the pair of electrodes disposed in a same processing chamber.

4. The bipolar pulsed power supply according to claim 1, wherein the electrodes are a pair of targets disposed in a vacuum chamber in which a sputtering method is carried out.

5. A power supply apparatus comprising a plurality of bipolar pulsed power supplies according to claim 4, the power supplies being connected in parallel with each other, wherein each of the bipolar pulsed power supplies is synchronized so as to output power in a bipolar pulsed mode to at least the pair of electrodes disposed in a same processing chamber.

6. A power supply apparatus comprising a plurality of bipolar pulsed power supplies according to claim 1, the power supplies being connected in parallel with each other, wherein each of the bipolar pulsed power supplies is synchronized so as to output power in a bipolar pulsed mode to at least the pair of electrodes disposed in a same processing chamber.

7. The bipolar pulsed power supply according to claim 1, wherein the electrodes are a pair of targets disposed in a vacuum chamber in which a sputtering method is carried out.

8. A power supply apparatus comprising a plurality of bipolar pulsed power supplies according to claim 7, the power supplies being connected in parallel with each other, wherein each of the bipolar pulsed power supplies is synchronized so as to output power in a bipolar pulsed mode to at least the pair of electrodes disposed in a same processing chamber.

9. A bipolar pulsed power supply comprising a bridge circuit made up of switching elements connected to positive and negative DC outputs from a DC power supply source so that, by controlling an operation of the switching elements, output is made, in a bipolar pulsed mode at a predetermined frequency, to a pair of electrodes that come into contact with a plasma,
wherein the bipolar pulsed power supply has an output characteristics switching circuit that switches the output when outputting to the electrodes such that the output to the electrodes has initially constant-voltage characteristics and that the output to the electrodes has thereafter constant-current characteristics, and
wherein the output characteristics switching circuit comprises:
an inductor which is disposed in at least one of the positive and negative DC outputs from the DC power supply source to the bridge circuit; and
a diode which is connected in parallel with the inductor such that the inductor is short-circuited at a time of occurrence of an overvoltage.

10. The bipolar pulsed power supply according to claim 9, wherein a resistor is connected in series with said another switching element or the diode.

11. A power supply apparatus comprising a plurality of bipolar pulsed power supplies according to claim 10, the power supplies being connected in parallel with each other, wherein each of the bipolar pulsed power supplies is synchronized so as to output power in a bipolar pulsed mode to at least the pair of electrodes disposed in a same processing chamber.

12. The bipolar pulsed power supply according to claim 9, wherein the electrodes are a pair of targets disposed in a vacuum chamber in which a sputtering method is carried out.

13. A power supply apparatus comprising a plurality of bipolar pulsed power supplies according to claim 12, the power supplies being connected in parallel with each other, wherein each of the bipolar pulsed power supplies is synchronized so as to output power in a bipolar pulsed mode to at least the pair of electrodes disposed in a same processing chamber.

14. A power supply apparatus comprising a plurality of bipolar pulsed power supplies according to claim 9, the power supplies being connected in parallel with each other, wherein each of the bipolar pulsed power supplies is synchronized so as to output power in a bipolar pulsed mode to at least the pair of electrodes disposed in a same processing chamber.

* * * * *